US012581619B2

(12) United States Patent
Zhang et al.

(10) Patent No.: US 12,581,619 B2
(45) Date of Patent: Mar. 17, 2026

(54) INTEGRAL WATER-COOLING RADIATOR

(71) Applicant: Dongguan songde hardware electronics co. LTD, Dongguan (CN)

(72) Inventors: Cheng Zhang, Dongguan (CN); Hong Yang, Dongguan (CN); Yuting Liu, Dongguan (CN); Hailang Wang, Dongguan (CN)

(73) Assignee: Dongguan songde hardware electronics co. LTD, Dongguan (CN)

( * ) Notice: Subject to any disclaimer, the term of this patent is extended or adjusted under 35 U.S.C. 154(b) by 128 days.

(21) Appl. No.: 18/597,877

(22) Filed: Mar. 6, 2024

(65) Prior Publication Data

US 2025/0254822 A1      Aug. 7, 2025

(30) Foreign Application Priority Data

Feb. 2, 2024     (CN) .......................... 202410150289.9

(51) Int. Cl.
*H05K 7/20*               (2006.01)

(52) U.S. Cl.
CPC ..... *H05K 7/20254* (2013.01); *H05K 7/20263* (2013.01); *H05K 7/20272* (2013.01)

(58) Field of Classification Search
CPC ........... H05K 7/20254; H05K 7/20263; H05K 7/20272
See application file for complete search history.

(56) References Cited

U.S. PATENT DOCUMENTS

| | | | | |
|---|---|---|---|---|
| 2017/0045306 A1* | 2/2017 | Tsai | ................... | H05K 7/20254 |
| 2017/0105312 A1* | 4/2017 | Tsai | ......................... | G06F 1/20 |
| 2017/0212560 A1* | 7/2017 | Tsai | ......................... | G06F 1/20 |
| 2017/0347487 A1* | 11/2017 | Rudnicki | ................ | F28F 13/12 |
| 2018/0023594 A1* | 1/2018 | Sheng | ...................... | F04D 1/06 |
| | | | | 165/104.31 |
| 2019/0239388 A1* | 8/2019 | Tsai | ................... | H05K 7/20254 |
| 2020/0141662 A1* | 5/2020 | Huang | ............... | H05K 7/20254 |

(Continued)

FOREIGN PATENT DOCUMENTS

| | | |
|---|---|---|
| CN | 108534583 A | 9/2018 |
| CN | 209525631 U | 10/2019 |
| CN | 210247388 U | 4/2020 |

*Primary Examiner* — Eric S Ruppert
*Assistant Examiner* — Hans R Weiland
(74) *Attorney, Agent, or Firm* — JEEN IP LAW, LLC

(57)               ABSTRACT
An integral water-cooling radiator includes a water cooling block having a fixed base with first and second through flow chambers. A rotatable impeller is arranged in the first chamber, and a drive chamber communicates with the first chamber. The first chamber defines an impeller region and first and second temporary storage regions with respective communications to inlets and outlets. A sealing cover body provides a copper bottom contact surface and rear heat-dissipating serration. A heat-dissipating copper member in the first chamber includes first and second support plates with bottom/top inlet holes and a flow region. A third support plate on the second plate abuts the serration and leaves bilateral gaps to form longitudinal wash flow along the serration. The first, second, and third plates are coaxially formed with a liquid-supply trough communicating with the first storage region to feed and stabilize flow, improving heat transfer while reducing cavitation and erosion.

8 Claims, 6 Drawing Sheets

(56)　　　　　　References Cited

U.S. PATENT DOCUMENTS

| | | | |
|---|---|---|---|
| 2020/0240417 A1* | 7/2020 | Shen | F04D 13/066 |
| 2020/0344912 A1* | 10/2020 | Lai | H05K 7/20254 |
| 2021/0195797 A1* | 6/2021 | Chen | H05K 7/20272 |
| 2023/0056832 A1* | 2/2023 | Tsai | G06F 1/20 |

* cited by examiner

INTEGRAL WATER-COOLING RADIATOR

CROSS-REFERENCE TO RELATED APPLICATIONS

The application claims priority to Chinese patent application No. 2024101502899, filed on Feb. 2, 2024, the entire contents of which are incorporated herein by reference.

TECHNICAL FIELD

The present invention relates to the field of water cooling technologies, and in particular to, an integral water-cooling radiator.

BACKGROUND

A water cooling block refers to a part that forcibly removes heat through liquid circulation. The water cooling block is primarily used for heat-generating components in the IT field, such as server chips, computer chips, or GPU chips.

The water cooling block is an important component in a water cooling system for heat dissipation. Its main function is to transfer heat to a water cooling block through direct contact with a heat-generating electronic component, and then remove the heat using a coolant in the water cooling block. The integral water cooling block is integrated from a water cooling block, a water pump, and a control circuit, and features compact structure and layout. The use of the integral water cooling block for heat dissipation can greatly simplify the water cooling system. A simple water cooling system for heat dissipation can be formed by only combining an integral water cooling block, a connection hose, and a water cooling radiator integrated with a fan.

Chinese patent application No. CN116075125A disclosed an integral water cooling block including a motor assembly, a fixed base, a heat exchange plate, an impeller, and a return pipe. The motor assembly is fixedly connected to an upper end surface of the fixed base and sealed, and the heat exchange plate is fixedly connected to a lower end surface of the fixed base and sealed. The fixed base and the heat exchange plate are fixedly connected to form a cavity. The heat exchange plate is fixedly connected to a guide vane disposed circumferentially. The guide vane splits the cavity into an impeller running region in an inner circle and an annular pressurized water chamber in an outer circle. The impeller is fixedly connected to an output rotation shaft of the motor assembly and located in the impeller running region. The return pipe communicates with the annular pressurized water chamber and the motor assembly from the outside of the integral water cooling block. The fixed base is provided with an inlet channel and an outlet channel for a cooling liquid. The inlet channel communicates with an inlet of the impeller, and the outlet channel communicates with the annular pressurized water chamber.

In the foregoing solution, the impeller is arranged in the cavity, and all the water cooling channels are formed in the cavity. During heat dissipation, the impeller rotates to generate negative pressure in the cavity, thus allowing the liquid to flow. Because during rotation, the impeller is in contact with the liquid, the liquid in the cavity collides with a cooling fin to cause serious cavitation erosion, which is likely to cause corrosion of the impeller exposing a large contact area, thus damaging the impeller.

SUMMARY

In view of the defects in the prior art, an objective of the present invention is to provide an integral water-cooling radiator.

To achieve the foregoing objective, the present invention provides the following technical solutions:

An integral water-cooling radiator is provided, including a water cooling block. The water cooling block includes a fixed base, the fixed base is formed with a first flow chamber and a second flow chamber, and the first flow chamber is mounted with an impeller member. The fixed base is formed with a first inlet and a first outlet in communication with the first flow chamber, and a second inlet and a second outlet are present between the first flow chamber and the second flow chamber. The first flow chamber and the second flow chamber are both through structures, the fixed base is further formed with a drive chamber in communication with the first flow chamber, and the drive chamber is provided with a drive member driving the impeller member to rotate.

Further, the drive member includes a drive motor mounted in the drive chamber, a drive end of the drive motor is connected to the impeller member, and a cross section of the drive chamber is circular; and a sealing shield cover is mounted at an opening of the second flow chamber, a periphery at the opening of the second flow chamber is formed with a mounting slot, and the mounting slot is mounted with a sealing ring abutting against the sealing shield cover.

Further, the fixed base is further formed with a plurality of first mounting pillars located at a periphery of the drive chamber and connected to a drive cover plate via the first mounting pillars, the first mounting pillar is coaxially formed with a first drive hole, and the drive cover plate is formed with a second drive hole coaxially aligned with the first drive hole.

Further, the first flow chamber is provided with an impeller region, and a first temporary storage region and a second temporary storage region that are separate from the impeller region. The impeller region communicates with the second inlet, the first temporary storage region communicates with the first inlet, the second temporary storage region communicates with the first outlet, and the second temporary storage region further communicates with the second outlet.

Further, the water cooling block further includes a sealing cover body connected to the fixed base, a front surface of the sealing cover body is formed with a copper bottom contact surface, a back surface of the sealing cover body is formed with a heat dissipating serration, and the first flow chamber is mounted with a heat dissipating copper member for a liquid to flow through.

Further, the fixed base is further formed with a plurality of second mounting pillars located at a periphery of the first flow chamber, the second mounting pillar is coaxially formed with a guide connection hole, and the sealing cover body is formed with a plurality of guide mounting holes coaxially aligned with the guide connection holes.

Further, the heat dissipating copper member includes a first support plate and a second support plate sequentially stacked from inside to outside. The first support plate is provided with a bottom inlet hole in communication with the first flow chamber; and the first support plate is formed with a flow region in communication with the bottom inlet hole. The second support plate is formed with a top inlet hole in communication with the flow region of the first support plate.

Further, a top of the second support plate is mounted with a third support plate abutting against the heat dissipating serration, and a gap for the liquid to flow is present between each of two opposite long edges of the third support plate and a chamber wall of the first flow chamber. The first support plate, the second support plate, and the third support plate are all coaxially formed with a liquid supply trough in communication with the first temporary storage region.

Further, the fixed base is further formed with a sealing groove in a square shape, the sealing groove is formed at a periphery of the first flow chamber, the sealing groove is mounted with a sealing ring, and the heat dissipating serration is coaxially aligned with the first flow chamber.

Further, the water cooling block is connected to a water drain, the water drain is mounted with a heat dissipating fan, and a first water cooling tube and a second water cooling tube are connected between the water drain and the water cooling block. An outer wall of the fixed base is mounted with an elbow joint in communication with each of the first inlet and the first outlet. The water drain is mounted with a liquid inlet head and a liquid outlet head, and the first water cooling tube is connected between the elbow joint of the first outlet and the liquid inlet head. The second water cooling tube is connected between the elbow joint of the first inlet and the liquid outlet head.

The present invention has the following beneficial effects: A water cooling liquid flows into the first flow chamber via the first inlet, and under the drive of an impeller member, is discharged via the first outlet, such that the water cooling liquid forcibly carries away heat for dissipation. In this solution, after entering the first flow chamber, the water cooling liquid flows into the second flow chamber via the first inlet and then is discharged from the second outlet via the first outlet. During heat dissipation, the contact pressure between the water cooling liquid and the impeller member decreases, facilitating protection for the impeller member. Next, the flow region of the water cooling liquid in the first flow chamber decreases, which alleviates the cavitation erosion and also the corrosion of the impeller member, making it uneasy to damage the impeller member. In addition, the water cooling liquid further flows through the second flow chamber, increasing the flow region, that is, the volume and reducing the load withstood by the impeller member. This allows for stability of the pump in running and prolongs the service life, such that the entire water cooling apparatus for heat dissipation is more energy-saving and efficient.

Figure 1:
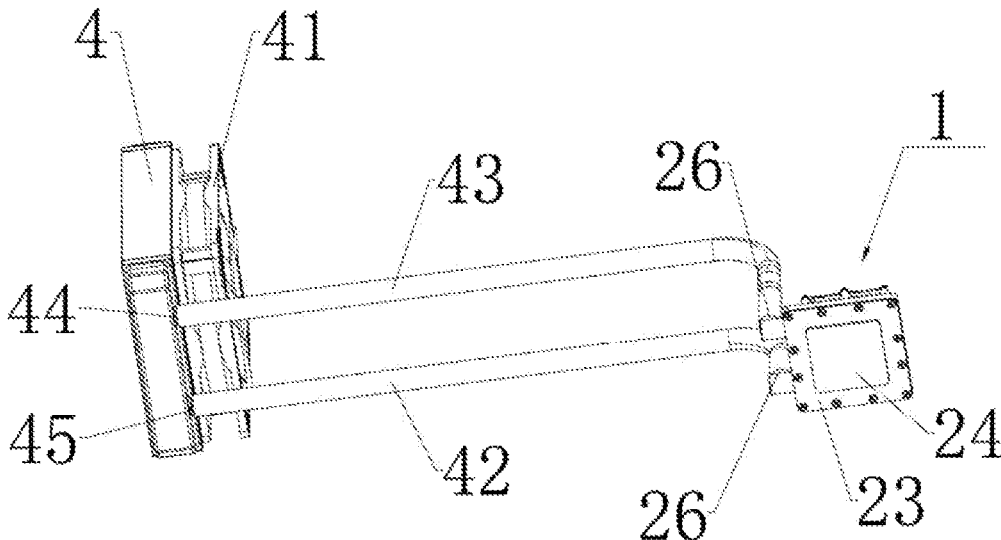
FIG. 1 is a schematic structural diagram of a radiator.

Reference numerals include:

1. water cooling block;

11. fixed base; 12. first flow chamber; 13. second flow chamber; 14. impeller member;

15. first inlet; 16. first outlet; 17. second inlet; 18. second outlet; 19. fixed housing;

2. impeller region;

21. first temporary storage region; 22. second temporary storage region; 23. sealing cover body; 24. copper bottom contact surface;

25. heat dissipating serration; 26. elbow joint; 27. sealing groove; 28. sealing ring;

3. heat dissipating copper member;

31. first support plate; 32. second support plate; 33. third support plate; 34. liquid supply trough;

35. top inlet hole; 36. flow region; 37. bottom inlet hole;

4. water drain;

41. heat dissipating fan; 42. first water cooling tube; 43. second water cooling tube; 44. liquid inlet head; 45. liquid outlet head;

5. drive chamber;

51. drive motor; 52. first mounting pillar; 53. drive cover plate; 54. first drive hole;

55. second drive hole; 56. sealing shield cover; 57. mounting slot; 58. sealing ring; 59. second mounting pillar;

60. guide connection hole; and 61. guide mounting hole.

DETAILED DESCRIPTION OF THE EMBODIMENTS

The present invention is described in detail below with reference to the drawings.

Figure 2:
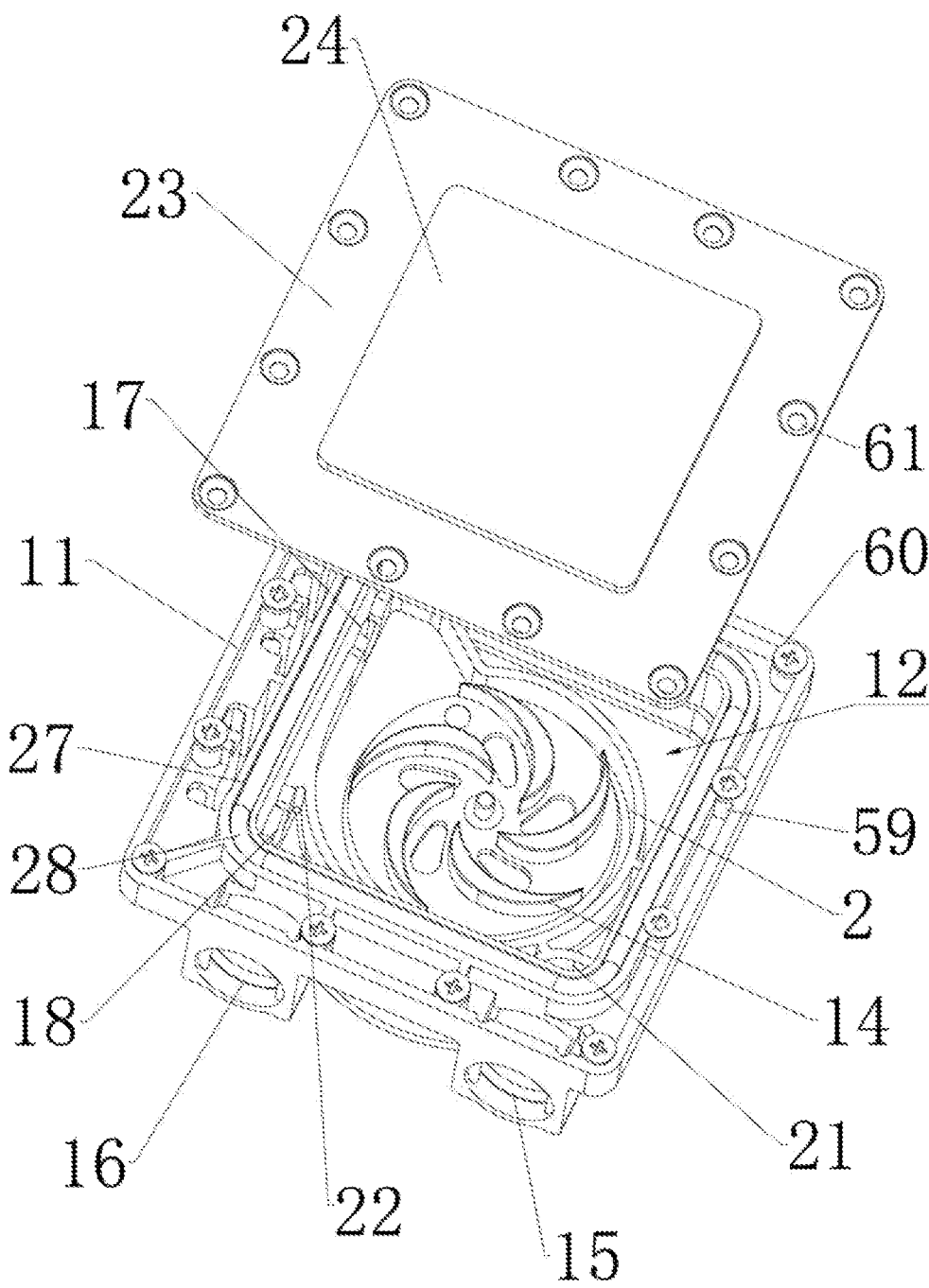
FIG. 2 is a schematic structural exploded view of a water cooling block.
Figure 3:
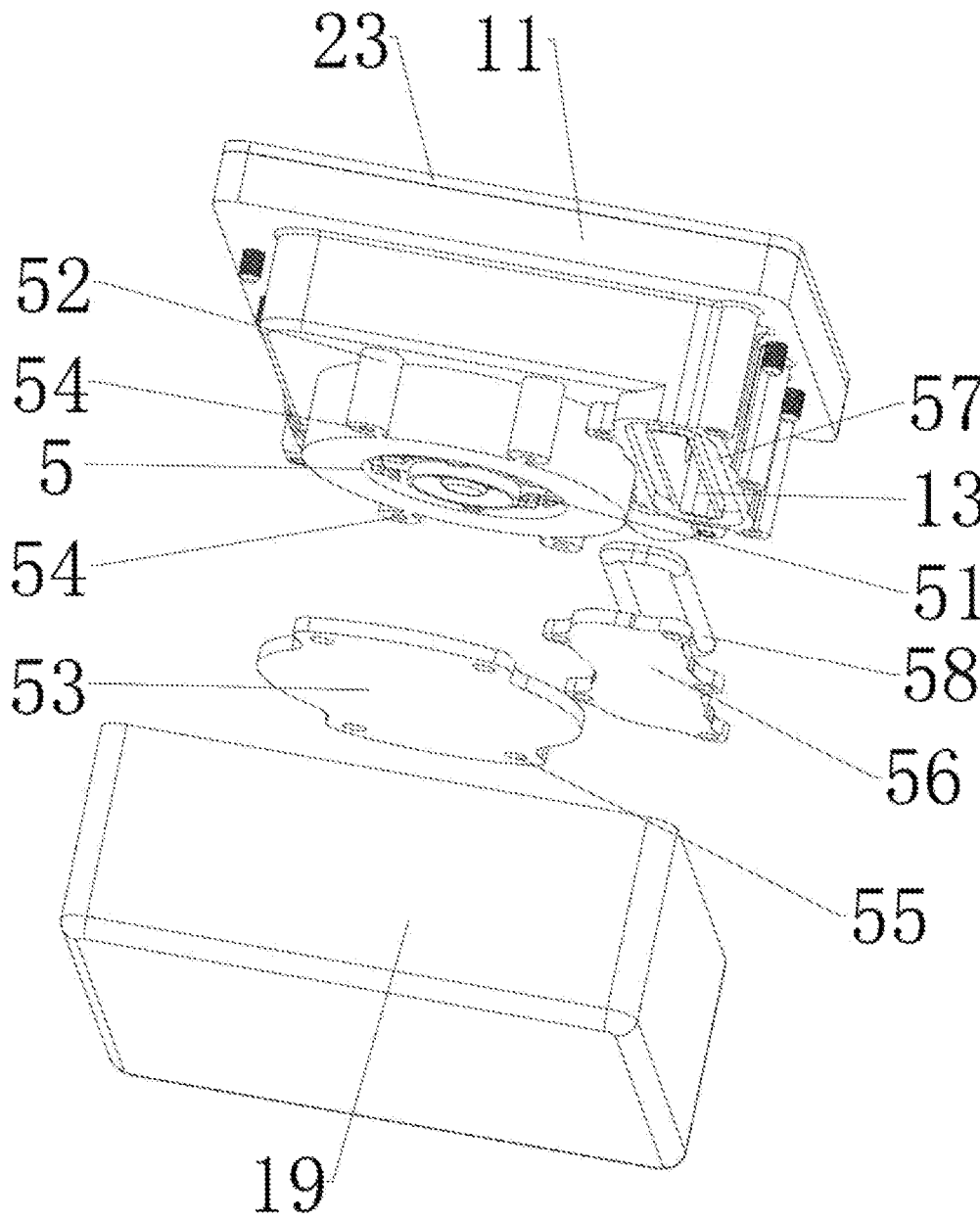
FIG. 3 is a schematic structural diagram of a fixed housing and a fixed base being separated.
Figure 4:
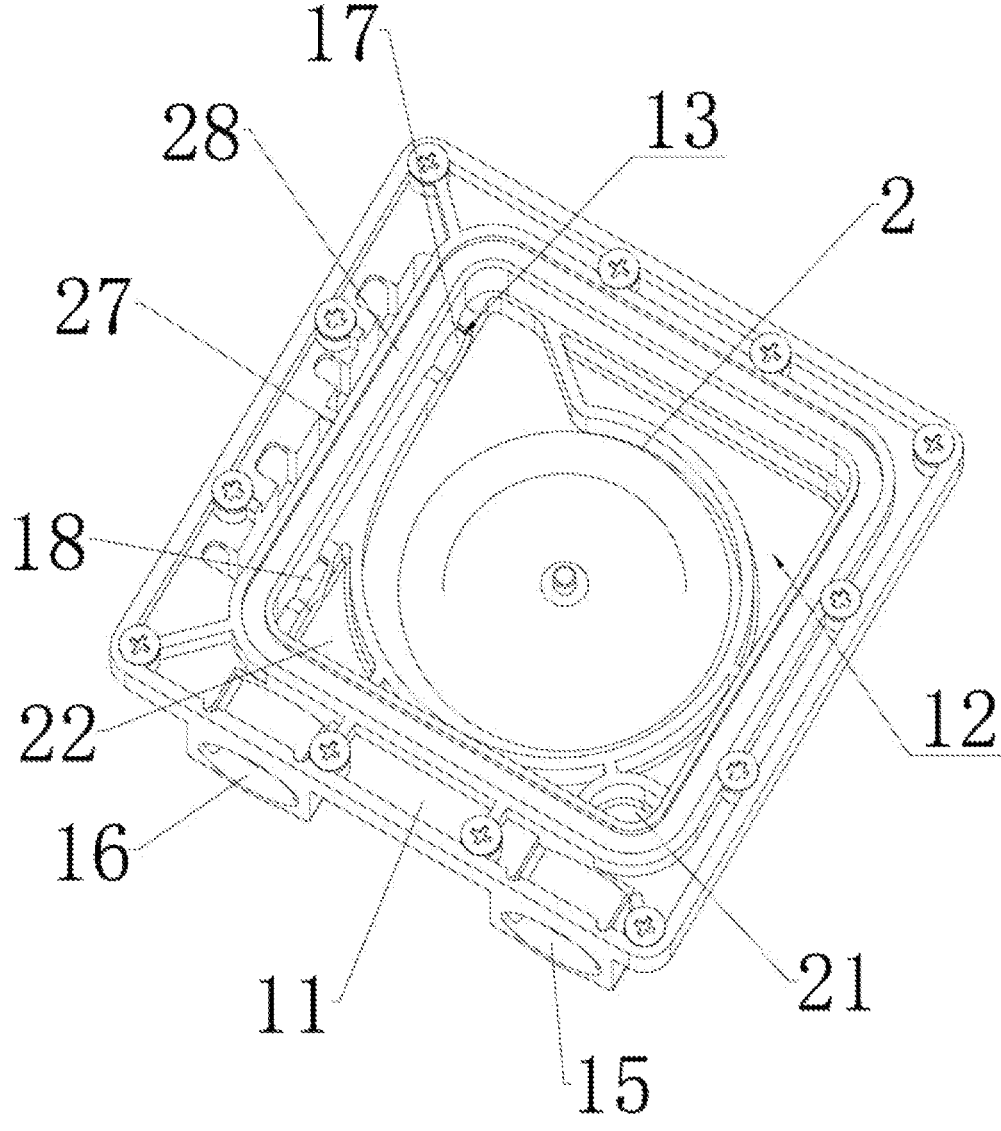
FIG. 4 is a schematic diagram of a liquid flow structure.
Figure 5:
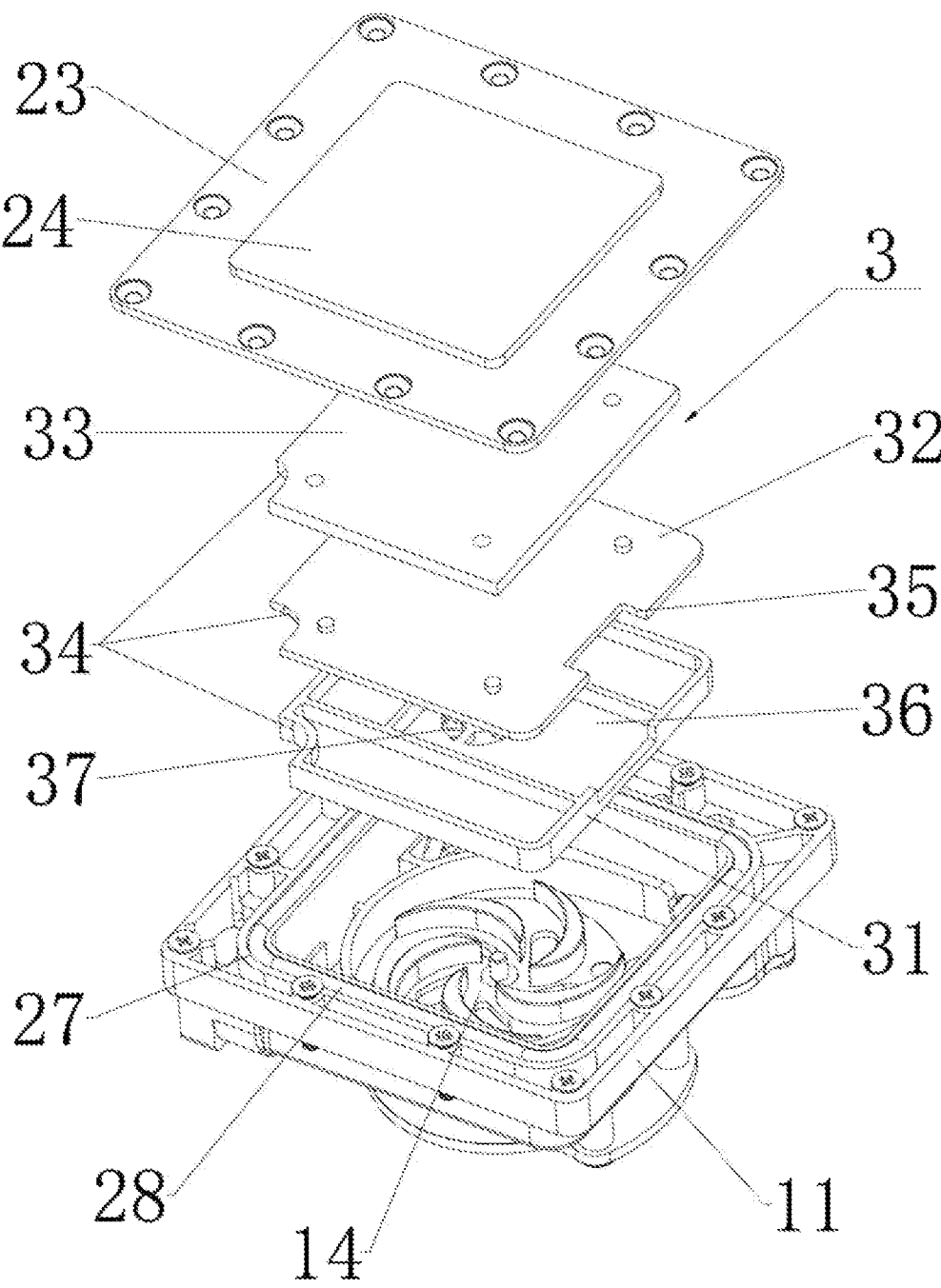
FIG. 5 is another schematic structural exploded view of a water cooling block.
Figure 6:
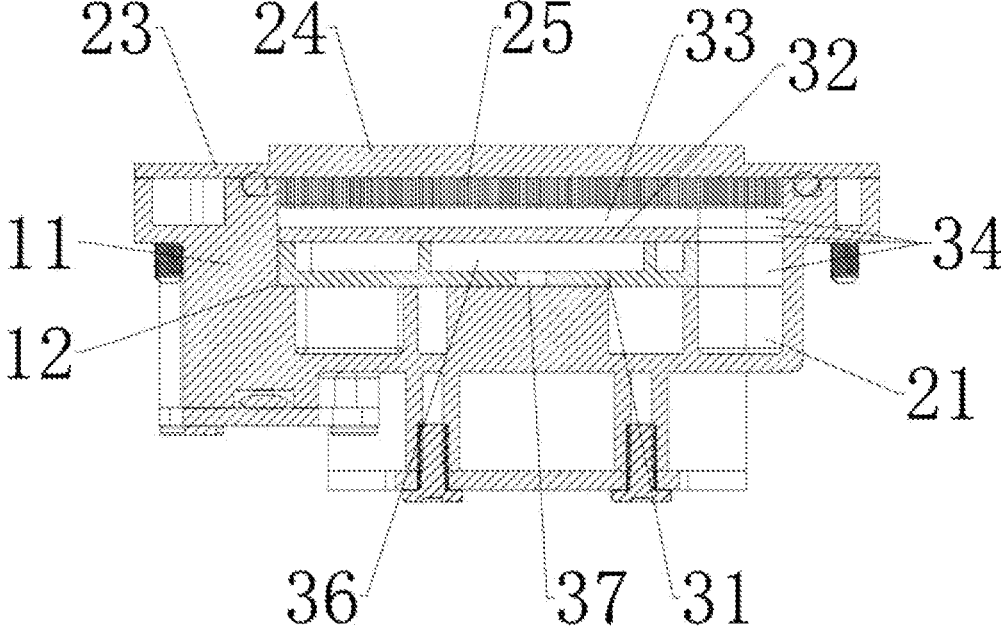
FIG. 6 is a schematic structural cross-sectional view of a water cooling block.

As shown in FIGS. 1 to 6, an integral water-cooling radiator is provided, including a water cooling block 1. The water cooling block 1 includes a fixed base 11, the fixed base 11 is formed with a first flow chamber 12 and a second flow chamber 13, and the first flow chamber 12 is mounted with a rotatable impeller member 14. The fixed base 11 is formed with a first inlet 15 and a first outlet 16 in communication with the first flow chamber 12, and a second inlet 17 and a second outlet 18 are present between the first flow chamber 12 and the second flow chamber 13.

A water cooling liquid flows into the first flow chamber 12 via the first inlet 15, and under the drive of an impeller member 14, is discharged via the first outlet 16, such that the water cooling liquid forcibly carries away heat for dissipation. In this solution, after entering the first flow chamber 12, the water cooling liquid flows into the second flow chamber 13 via the first inlet 15 and then is discharged from the second outlet 18 via the first outlet 16. During heat dissipation, the contact region between the water cooling liquid and the impeller member 14 decreases, facilitating protection for the impeller member 14. Next, the flow region of the water cooling liquid in the first flow chamber 12 decreases, which alleviates the cavitation erosion and also the corrosion of the impeller member 14, making it uneasy to damage the impeller member 14. In addition, the water cooling liquid further flows through the second flow chamber 13. As compared with a single conventional flow chamber, the increase of the flow region further enhances the heat dissipation effect of the water cooling liquid, allowing for better overall heat dissipation effect. In addition, compared with a single flow chamber, the increase of the flow region causes a significant decrease in load of the impeller member and prolongs the service life.

The first flow chamber 12 is a through structure. The fixed base 11 is further formed with a drive chamber 5 in communication with the first flow chamber 12. The drive chamber 5 is provided with a drive member driving the impeller member 14 to rotate. The drive member includes a drive motor 51 mounted in the drive chamber 5, a drive end of the drive motor 51 is connected to the impeller member 14, and a cross section of the drive chamber 5 is circular. A drive shaft is mounted at a drive end of the drive motor 51, and the drive shaft passes through the drive chamber 5 to enter the first flow chamber 12, so as to be connected to the impeller member 14 of the first flow chamber 12. The drive motor 51 rotatably drives the impeller member 14 in the first flow chamber 12 to rotate, enabling the water cooling liquid in the first flow chamber 12 to flow. Compared with the conventional arrangement of one flow region, because the flow region of the water cooling liquid increases, the water cooling liquid does not accumulate in one flow chamber. This reduces the load withstood by the impeller member 14, facilitates an increase in the service life of the impeller member 14, reduces the overall temperature of the drive motor 51 driving the impeller member 14 to rotate, and makes the output power stable, so as to improve the pump efficiency, significantly improving the flow efficiency of the water cooling liquid, thus greatly enhancing the overall heat dissipation effect of the water cooling block.

Preferably, the fixed base 11 is further formed with a plurality of first mounting pillars 52 located at a periphery of the drive chamber 5 and connected to a drive cover plate 53 via the first mounting pillars 52. The first mounting pillar 52 is coaxially formed with a first drive hole 54, and the drive cover plate 53 is formed with a second drive hole 55 coaxially aligned with the first drive hole 54. The drive cover plate 53 can shield the drive chamber 5, making the drive motor 51 not exposed outside. During mounting, the second drive hole 55 of the drive cover plate 53 is coaxially aligned with the first drive shaft of the first mounting pillar 52, and then a bolt is inserted for connection.

Further, a back portion of the fixed base 11 is mounted with a fixed housing 19. The fixed housing 19 can partially shield the protrusions of the first flow chamber 12 and the second flow chamber 13, making the entire water cooling block in a rectangular shape, thus allowing for strong integrity and aesthetic appearance.

Preferably, the second flow chamber 13 is a through structure. A sealing shield cover 56 is mounted at an opening of the second flow chamber 13, a periphery at the opening of the second flow chamber is formed with a mounting slot 57, and the mounting slot 57 is mounted with a sealing ring 58 abutting against the sealing shield cover 56, to implement sealed mounting after the sealing shield cover 56 is mounted, preventing liquid leak. As the second flow chamber is arranged as a through structure, the situation in the second flow chamber can be viewed by disassembling the sealing shield cover 56. When the second flow chamber is clogged by debris or foreign objects, the sealing shield cover 56 can be disassembled for cleaning, so as to maintain the water cooling block.

The first flow chamber 12 is provided with an impeller region 2, and a first temporary storage region 21 and a second temporary storage region 22 that are separate from the impeller region 2. After the first temporary storage region 21 and the second temporary storage region 22 are separated from the impeller region 2, the water cooling liquids in corresponding regions do not communicate with each other.

The first temporary storage region 21 communicates with the first inlet 15, and the second temporary storage region 22 communicates with the first inlet 15. The water cooling liquid flows into the first flow chamber 12 via the first inlet 15 and aggregates in the first temporary storage region 21. Correspondingly, the water cooling liquid to be discharged aggregates in the second temporary storage region 22 and then is discharged via the first outlet 16.

The second temporary storage region 22 further communicates with the second outlet 18. The water cooling liquid that has passed through the second flow chamber 13 is delivered to the second temporary storage region 22 via the second outlet 18 and discharged from the second temporary storage region 22 via the first outlet 16, achieving liquid exchange.

The fixed base 11 is connected to a sealing cover body 23, and the sealing cover body 23 is processed and molded from a copper material, having good thermal conductivity. A front surface of the sealing cover body 23 is formed with a copper bottom contact surface 24, a back surface of the sealing cover body 23 is formed with a heat dissipating serration 25, the heat dissipating serration 25 is coaxially aligned with the first flow chamber 12, and the first flow chamber 12 is mounted with a heat dissipating copper member 3 for a liquid to flow through. The water cooling block 1 is in contact, via the copper bottom contact surface 24, with an electronic element requiring heat dissipation, having good thermal conductivity. After the water cooling liquid enters the first flow chamber 12, it passes through the heat dissipating serration 25 on the back surface of the sealing cover body 23. The heat dissipating serration 25 is in full contact with the water cooling liquid to cool the sealing cover body 23, and the heat dissipating copper member 3 guides the liquid to the impeller region 2.

Specifically, the heat dissipating copper member 3 includes a first support plate 31 and a second support plate 32 sequentially stacked from inside to outside. The first support plate 31 is provided with a bottom inlet hole 37 in communication with the first flow chamber 12. The first support plate 31 is formed with a flow region 36 in communication with the bottom inlet hole 37. The second support plate 32 is formed with a top inlet hole 35 in communication with the flow region 36 of the first support plate 31. The water cooling liquid enters the water cooling block 1, the flow region 36 of the first support plate 31 via the top inlet hole 35 of the second support plate 32, and the impeller region 2 via the bottom inlet hole 37. The impeller member 14 in the impeller region 2 rotates to deliver the water cooling liquid to the second flow chamber 13, enabling the water cooling liquid to flow. When flowing, the water cooling liquid passes through the heat dissipating serration 25 on the back surface of the sealing cover body 23 to cool the sealing cover body 23.

Further, a top of the second support plate 32 is mounted with a third support plate 33 abutting against the heat dissipating serration 25, and a width of the third support plate 33 is less than a width of the second support plate 32. A gap for the liquid to flow is present between each of two opposite long edges of the third support plate 33 and a chamber wall of the first flow chamber 12. The first support plate 31, the second support plate 32, and the third support plate 33 are all coaxially formed with a liquid supply trough 34 in communication with the first temporary storage region 21. After entering the first temporary storage region 21 via the first inlet 15, the water cooling liquid passes through the liquid supply trough 34 of the first support plate 31, the second support plate 32, and the third support plate 33 to enter the top. Then, the water cooling liquid flows through the gap between the third support plate 33 and the chamber wall of the first flow chamber 12 and keeps going along the length direction of the heat dissipating serration 25. The water cooling liquid is full in contact with the heat dissipating serration 25, to cool the sealing cover body 23 quickly. After the water cooling liquid reaches the other side of the third support plate 33, it flows into the flow region 36 of the first support plate 31 via the top inlet hole 35, and then enters the impeller region 2 via the bottom inlet hole 37 from the flow region 36.

The impeller region 2 communicates with the second inlet 17. The water cooling liquid enters the impeller region 2 and is guided by the rotation of the impeller member 14 to flow towards the second inlet 17. Then, the water cooling liquid is guided via the second inlet 17 to enter the second flow chamber 13.

The fixed base 11 is further formed with a sealing groove 27 in a square shape, the sealing groove 27 is formed at a periphery of the first flow chamber 12, and the sealing groove 27 is mounted with a sealing ring 28. After the sealing cover body 23 is attached to the fixed base 11, the sealing ring 28 can isolate the first flow chamber 12, such that the water cooling liquid in the first flow chamber 12 does not overflow, thus achieving water-proof effect.

Preferably, the fixed base 11 is further formed with a plurality of second mounting pillars 59 located at a periphery of the first flow chamber 12, the second mounting pillar 59 is coaxially formed with a guide connection hole 60, and the sealing cover body 23 is formed with a plurality of guide mounting holes 61 coaxially aligned with the guide connection holes 60. When the sealing cover body 23 is connected to the fixed base, the guide mounting hole 61 of the sealing cover body 23 is coaxially aligned with the guide connection hole 60 of the fixed base, and then a bolt is inserted to sealingly connect the fixed base 11 and the sealing cover body 23, preventing the water cooling liquid in the fixed base 11 from leaking outside, exerting good sealing performance.

The water cooling block 1 is connected to a water drain 4, the water drain 4 is mounted with a heat dissipating fan 41, and a first water cooling tube 42 and a second water cooling tube 43 are connected between the water drain 4 and the water cooling block 1. After passing through the water cooling block 1, the liquid flows into the water drain 4 through the first water cooling tube 42. After cooled by the water drain 4, the water cooling liquid returns to the water cooling block 1 through the second water cooling tube 43, thus achieving the cycling of the water cooling liquid.

Preferably, an outer wall of the fixed base 11 is mounted with an elbow joint 26 in communication with each of first inlet 15 and the first outlet 16. The water drain 4 is mounted with a liquid inlet head 44 and a liquid outlet head 45, and the first water cooling tube 42 is connected between the elbow joint 26 of the first outlet 16 and the liquid inlet head 44. The second water cooling tube 43 is connected between the elbow joint 26 of the first inlet 15 and the liquid outlet head 45. The water cooling liquid in the water cooling block 1 passes through the first outlet 16 and the elbow joint 26 and enters the water drain 4 through connection between the first water cooling tube 42 and the liquid inlet head 44. The heat dissipating fan 41 expels the heat generated by the water drain 4, completing heat dissipation. Then the water cooling liquid after heat dissipation is discharged via the liquid outlet head 45. The second water cooling tube 43 is connected to the elbow joint 26 of the first inlet 15 of the water cooling block 1, achieving cycling of the water cooling liquid.

In summary, it can be seen that the present invention possesses the good features described above, and during use, the present invention adds performance not found in the prior art and provides a product with practical value.

The above content is only the preferred embodiment of the present invention. Those of ordinary skill in the art, based on the concept of the present invention, may make changes in specific implementations and application ranges. The content of this specification should not be understood as limitation on the present invention.

What is claimed is:

1. An integral water-cooling radiator, comprising a water cooling block, wherein the water cooling block comprises a fixed base and a sealing cover body; the fixed base is formed with a first flow chamber and a second flow chamber, and the first flow chamber is mounted with an impeller member and divided into an impeller region, and a first temporary storage region and a second temporary storage region that are separate from the impeller region; and the fixed base is formed with a first inlet and a first outlet in communication with the first flow chamber, and a second inlet and a second outlet are present between the first flow chamber and the second flow chamber; and the first flow chamber and the second flow chamber are both through structures, the fixed base is further formed with a drive chamber in communication with the first flow chamber, and the drive chamber is provided with a drive member driving the impeller member to rotate;

the sealing cover body is connected to the fixed base, a front surface of the sealing cover body is formed with a copper bottom contact surface, a back surface of the sealing cover body is formed with a heat dissipating serration, and the first flow chamber is mounted with a heat dissipating copper member for a liquid to flow through;

the heat dissipating copper member comprises a first support plate and a second support plate sequentially stacked from inside to outside, and a third support plate mounted on the top of the second support plate;

the third support plate abutting against the heat dissipating serration, and a gap for the liquid to flow is present between each of two opposite long edges of the third support plate and a chamber wall of the first flow chamber; and the first support plate, the second support plate, and the third support plate are all coaxially formed with a liquid supply trough in communication with the first temporary storage region.

2. The integral water-cooling radiator according to claim 1, wherein the drive member comprises a drive motor mounted in the drive chamber, a drive end of the drive motor is connected to the impeller member, and a cross section of the drive chamber is circular; and a sealing shield cover is mounted at an opening of the second flow chamber, a periphery at the opening of the second flow chamber is formed with a mounting slot, and the mounting slot is mounted with a sealing ring abutting against the sealing shield cover.

3. The integral water-cooling radiator according to claim 2, wherein the fixed base is further formed with a plurality of a first mounting pillars located at a periphery of the drive chamber and connected to a drive cover plate via the first mounting pillars, each the first mounting pillar is coaxially formed with a first drive hole, and the drive cover plate is formed with a second drive hole coaxially aligned with the first drive hole.

4. The integral water-cooling radiator according to claim 1, wherein the impeller region communicates with the second inlet, the first temporary storage region communicates with the first inlet, the second temporary storage region communicates with the first outlet, and the second temporary storage region further communicates with the second outlet.

5. The integral water-cooling radiator according to claim 4, wherein the fixed base is further formed with a plurality of a second mounting pillars located at a periphery of the first flow chamber, the second mounting pillar is coaxially formed with a guide connection hole, and the sealing cover body is formed with a plurality of guide mounting holes coaxially aligned with the guide connection holes.

6. The integral water-cooling radiator according to claim 1, wherein the first support plate is provided with a bottom inlet hole in communication with the first flow chamber; and the first support plate is formed with a flow region in communication with the bottom inlet hole, and the second support plate is formed with a top inlet hole in communication with the flow region of the first support plate.

7. The integral water-cooling radiator according to claim 6, wherein the fixed base is further formed with a sealing groove in a square shape, the sealing groove is formed at a periphery of the first flow chamber, the sealing groove is mounted with the sealing ring, and the heat dissipating serration is coaxially aligned with the first flow chamber.

8. The integral water-cooling radiator according to claim 1, wherein the water cooling block is connected to a heat exchanger, the heat exchanger is mounted with a heat dissipating fan, a first water cooling tube and a second water cooling tube are connected between the heat exchanger and the water cooling block, an outer wall of the fixed base is mounted with an elbow joint in communication with each of the first inlet and the first outlet, the heat exchanger is mounted with a liquid inlet head and a liquid outlet head, and the first water cooling tube is connected between the elbow joint of the first outlet and the liquid inlet head; and the second water cooling tube is connected between the elbow joint of the first inlet and the liquid outlet head.

\* \* \* \* \*